United States Patent [19]

Sugimoto et al.

[11] Patent Number: 5,414,639
[45] Date of Patent: May 9, 1995

[54] AUTOMATIC TESTING METHOD AND TESTING APPARATUS FOR DEVICES

[75] Inventors: Takatoshi Sugimoto; Hideaki Yoshimura; Masayuki Suzuki, all of Kanagawa, Japan

[73] Assignee: Sony Corporation, Tokyo, Japan

[21] Appl. No.: 183,358

[22] Filed: Jan. 19, 1994

[30] Foreign Application Priority Data

Jan. 19, 1993 [JP] Japan .................................. 5-023806
Jan. 19, 1993 [JP] Japan .................................. 5-023808

[51] Int. Cl.6 ...................... G01D 21/00; G01R 31/00; G06F 11/00
[52] U.S. Cl. .................... 364/489; 364/579; 324/73.1; 371/16.1
[58] Field of Search ............... 364/489, 491, 578–580; 371/23, 27, 16.2, 16.1; 324/73 R, 158 R, 73.1

[56] References Cited

U.S. PATENT DOCUMENTS

| | | | |
|---|---|---|---|
| 4,686,627 | 8/1987 | Donovan et al. | 364/489 |
| 4,764,925 | 8/1988 | Grimes et al. | 371/27 |
| 4,878,179 | 10/1989 | Larsen et al. | 364/490 |
| 5,020,010 | 5/1991 | Ogata et al. | 364/489 |
| 5,036,479 | 7/1991 | Prednis et al. | 364/580 |
| 5,043,910 | 8/1991 | Chiba | 364/489 |
| 5,111,459 | 5/1992 | De Vigne | 371/27 |
| 5,282,146 | 1/1994 | Aihara et al. | 364/489 |
| 5,297,066 | 3/1994 | Mayes | 364/489 |

Primary Examiner—Kevin J. Teska
Assistant Examiner—Tyrone V. Walker
Attorney, Agent, or Firm—Hill, Steadman & Simpson

[57] ABSTRACT

In a testing method and a testing circuit design apparatus for a multi-terminal device, the testing circuit design apparatus includes an input unit for inputting data of an ideal testing circuit, a storage unit for storing the data of the ideal testing circuit input from the input unit, a knowledge base unit having a knowledge base in which a knowledge base and a testing method suitable for a tester of each manufacturer are described, and a testing circuit conversion unit for converting the data of the ideal testing circuit written in the storage unit to data of an actual testing circuit actually used for characteristic measurement on the basis of each knowledge base of the knowledge base unit, and for writing the converted data into the storage unit. The number n of points under test of the device board and the number M of resources of the tester are read out, and the number n of the points under test and the number M of the resources are compared with each other. The tester and the device board are connected to each other in accordance with a comparison result.

7 Claims, 16 Drawing Sheets

| ITEM | $L_1$ | $L_2$ | $L_3$ | $L_4$ | $L_5$ |
|------|-------|-------|-------|-------|-------|
| T1   | 1v    | 1v    | 1v    | 2v    | 3v    |
| T2   | 1v    | 1v    | 2v    | 1v    | 3v    |
| T3   | 1v    | 2v    | 1v    | 1v    | 4v    |
| T4   | 1v    | 1v    | 1v    | 1v    | 4v    |
| T5   | 2v    | 1v    | 1v    | 1v    | 3v    |

Fig.7

| ITEM | $V_1$ | $V_2$ | $V_3$ | $V_4$ | $V_5$ |
|------|----|----|----|----|----|
| T1   | 1v | 1v | 1v | 2v | 3v |
| T2   | 1v | 1v | 2v | 1v | 3v |
| T3   | 1v | 2v | 1v | 1v | 4v |
| T4   | 1v | 1v | 1v | 1v | 4v |
| T5   | 2v | 1v | 1v | 1v | 3v |

Fig.8

| ITEM | $L_1$ | $L_2$ | $L_3$ | $L_4$ | $L_5$ | $L_6$ |
|------|----|----|----|----|----|----|
| T1   | 1v | 1v | 2v | 1v | 1v | 7v |
| T2   | 1v | 2v | 1v | 3v | 1v | 8v |
| T3   | 2v | 1v | 1v | 4v | 7v | 1v |
| T4   | 1v | 1v | 1v | 5v | 8v | 1v |

| ITEM | R₁ | R₂ | R₃ | R₄ | R₅ | R₆ | R₇ | R₈ | R₉ | R₁₀ | R₁₁ | R₁₂ |
|---|---|---|---|---|---|---|---|---|---|---|---|---|
| T1 | ON |  | ON |  | ON | ON |  | ON |  |  |  | ON |
| T2 | ON |  |  | ON | ON |  |  | ON | ON |  |  | ON |
| T3 |  | ON | ON |  | ON |  |  | ON |  | ON | ON |  |
| T4 | ON |  | ON |  | ON |  |  | ON |  | ON | ON |  |

SET CONDITIONS OF RELAYS

| ITEM | V₁ | V₂ | V₃ | V₄* |
|---|---|---|---|---|
| T1 | 1V | 2V | / | 7V |
| T2 | 1V | 2V | 3V | 8V |
| T3 | 1V | 2V | 4V | 7V |
| T4 | 1V | 2V | 5V | 8V |

SET CONDITIONS OF
VOLTAGE RESOURCES

V₄* REPRESENTS
TEMPORARY RESOURCE

SET CONDITIONS OF RELAYS

| ITEM | $R_1$ | $R_2$ | $R_3$ | $R_4$ | $R_5$ | $R_6$ | $R_9$ | $R_{10}$ | $R_{11}$ | $R_{12}$ |
|---|---|---|---|---|---|---|---|---|---|---|
| T1 | ON | | ON | | | ON | ON | | | ON |
| T2 | ON | | | ON | ON | | ON | | | ON |
| T3 | | ON | ON | | ON | | | ON | ON | |
| T4 | ON | | ON | | ON | | | ON | ON | |

SET CONDITIONS OF RESOURCES

| ITEM | $V_1$ | $V_2$ | $V_3$ | $V_4^*$ |
|---|---|---|---|---|
| T1 | 1V | 2V | 1V | 7V |
| T2 | 1V | 2V | 3V | 8V |
| T3 | 1V | 2V | 4V | 7V |
| T4 | 1V | 2V | 5V | 8V |

$V_4^*$ REPRESENTS TEMPORARY RESOURCE

| ITEM | $R_3$ | $R_4$ | $R_5$ | $R_6$ | $R_9$ | $R_{10}$ | $R_{11}$ | $R_{12}$ |
|---|---|---|---|---|---|---|---|---|
| T1 | ON | | | ON | ON | | | ON |
| T2 | | ON | ON | | ON | | | ON |
| T3 | ON | | ON | | | ON | ON | |
| T4 | ON | | ON | | | ON | ON | |

SET CONDITIONS OF RELAYS

| ITEM | $V_1$ | $V_2$ | $V_3$ | $V_4$ | $V_5$ |
|---|---|---|---|---|---|
| T1 | 1V | 2V | 1V | 7V | 1V |
| T2 | 1V | 2V | 3V | 8V | 1V |
| T3 | 1V | 2V | 4V | 7V | 2V |
| T4 | 1V | 2V | 5V | 8V | 1V |

SET CONDITIONS OF TESTER RESOURCES

TESTING ITEM 1

TESTING ITEM 2

TESTING ITEM 3

TESTING ITEM 4

OVERALL TESTING CIRCUIT

RELAY CONDITION FILE

| TESTING ITEM | $R_L$-1 | $R_L$-2 | $R_L$-3 | $R_L$-4 |
|---|---|---|---|---|
| ITEM 1 | ON  | —   | ON  | OFF |
| ITEM 2 | OFF | ON  | ON  | ON  |
| ITEM 3 | OFF | OFF | OFF | OFF |
| ITEM 4 | OFF | OFF | ON  | OFF |

Fig. 23A
EXTRACTION OF ELEMENTS TO BE CONNECTED TO TERMINAL A
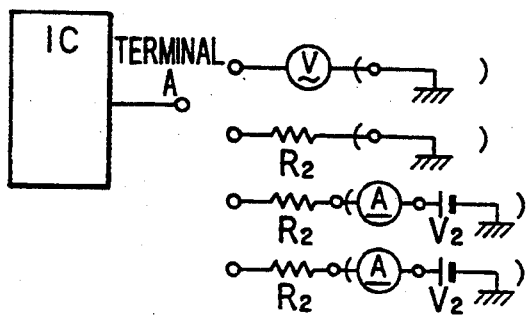
Fig. 23B
COLLECTION OF SAME ELEMENTS
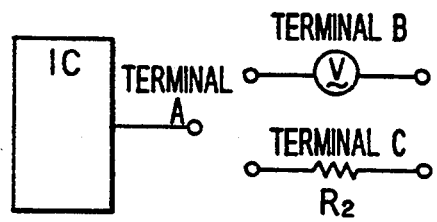
Fig. 23C
CONNECTION OF TERMINAL A AND ELEMENTS (B, C) THROUGH MAKE-RELAY
Fig. 23D
CONVERSION TO TRANSFER RELAY
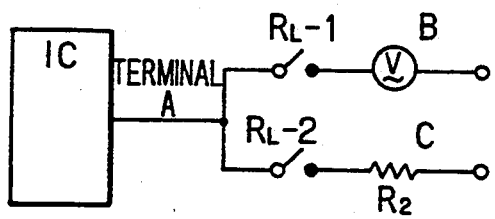
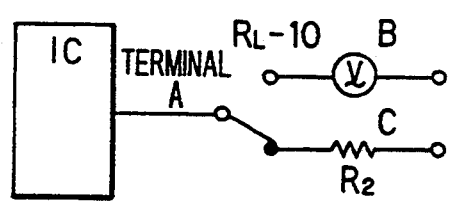
Fig. 24
| TESTING ITEM | $R_L$-1 | $R_L$-2 |
|---|---|---|
| 1 | ON | OFF |
| 2 | OFF | ON |
| 3 | OFF | ON |
| 4 | OFF | ON |
RELAY CONDITIONS
| TESTING ITEM | $R_L$-10 |
|---|---|
| 1 | ON |
| 2 | OFF |
| 3 | OFF |
| 4 | OFF |
RELAY CONDITIONS

AUTOMATIC TESTING METHOD AND TESTING APPARATUS FOR DEVICES

BACKGROUND OF THE INVENTION

1. Field of the Invention

This invention relates to a testing (measuring) circuit design apparatus for a multi-terminal device, and particularly to a testing circuit design apparatus which is suitably used for design of a testing circuit for testing (measuring) characteristics of a multi-terminal device such as a semiconductor integrated circuit (IC) or the like.

2. Description of the Related Art

Measurement (or testing) of characteristics of a device having many terminals (hereinafter referred to as "multi-terminal device") such as an integrated circuit (IC) has been carried out using an exclusive tester. However, the characteristic and the specification of the tester are not unified among manufacturers, and thus are different. Therefore, for the testing of the characteristics of an IC, a peripheral circuit (hereinafter referred to as "device board") which is suitable for the characteristics and the specification of an employed tester is designed beforehand, and the device board thus designed is disposed between the tester and the IC to carry out the testing of the IC characteristics.

In order to connect a tester and a device board for the testing when the device board is designed, an engineer who specializes in the design of device boards (hereinafter referred to as "test engineer") has conventionally adopted a connecting method that a point of the device board under testing (hereinafter referred to as "point under test") and a tester resource (resource) are connected to each other on the basis of the specification of an employed tester so that all testing (measurement) items are satisfied.

However, such a circuit design requires a special technical knowledge, and also requires a large number of steps for a process. Further, a produced circuit has an individual manufacturer's personal character, and thus those circuits which have been produced by different manufacturers have no unification in wiring rules. Accordingly, maintenance of the circuits produced cannot be performed well. In addition, the test engineer does not necessarily perform the most rational connection between the tester and the device boards. Accordingly, this connection method has the problem that there occurs a case where some tester sources are not effectively used in accordance with the connection manner.

Furthermore, the test engineer conventionally designs an IC testing circuit on the basis of the specification for an IC which is written by an IC designer. Accordingly, the test engineer is required to be familiar with the specification and the characteristics of an individual tester to be used, but it takes a long time to satisfy this requirement. In addition, the number of test engineers is now being reduced, that is, a human resource is now lacking, so that a large number of novel IC designs which increases year by year have not been treated at present.

SUMMARY OF THE INVENTION

An object of this invention is to provide a method of connecting a tester and a device board in which the number of circuit design steps can be greatly reduced, maintenance of a produced circuit can be excellently performed, and tester resources can be rationally used.

Another object of this invention is to provide a testing circuit design apparatus for a multi-terminal device which is capable of rapidly following alteration of a tester to be used.

According to the invention, a connection system and method is provided for connecting a tester for measuring characteristics of a multi-terminal device. A device board is disposed between the multi-terminal device and the tester. A number n of points under test of the device board is read out and a number M of resources of the tester is read out. The number n of the points under test and the number M of the resources of the tester are compared, and the tester and the device board are connected in accordance with a result of the comparison.

BRIEF DESCRIPTION OF THE DRAWINGS

FIG. 2 is a first flowchart showing an algorithm of a connection method of this invention;

FIG. 3 is a second flowchart of the algorithm of the connection method according to this invention;

FIG. 4 is a third flowchart showing the algorithm of the connection method according to this invention;

FIG. 7 is a table showing set conditions of tester resources;

FIG. 8 is a table showing set conditions of points under test (L1 to L6);

FIGS. 23A to 23D circuit diagram showing a circuit status in each step of the circuit composite; and FIG. 24 is a table showing relay conditions.

DETAILED DESCRIPTION OF THE PREFERRED EMBODIMENTS

Preferred embodiments according to this invention will be described hereunder with reference to the accompanying drawings.

Figure 1:
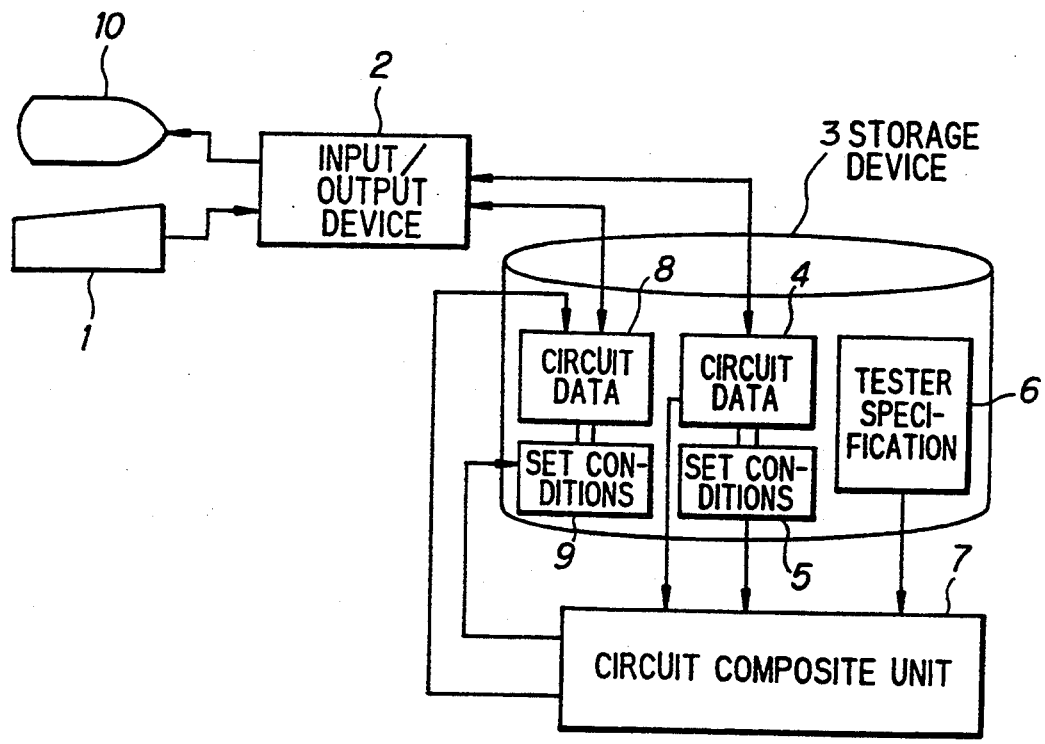
FIG. 1 is a system block diagram of a device board circuit design apparatus of a first embodiment according to this invention.

FIG. 1 is a systematic block diagram showing an embodiment of a device board circuit design apparatus according to this invention.

In FIG. 1, data on a device board circuit and data on set conditions for each test are input through an input unit 1 such as a key board or the like by an operator, and these data are stored as a circuit data base 4 and a set condition base 5 in a predetermined area of a storage device 3 through an input/output device 2. In the storage device 3 a tester specification base 6 is stored beforehand in which a function specification for a tester is described.

Each data of the circuit data base 4, the set condition base 5 and the tester specification base 6 is supplied to a circuit composite unit 7 as information required for a circuit composite of the device board circuit.

The circuit composite unit 7 comprises a microcomputer. The circuit composite unit 7 carries out the circuit composite processing of the device board circuit on the basis of each data of the circuit data base 4, the set condition base 5 and the tester specification base 6, and stores the data on the composited device board and the data on the set conditions for each test in a predetermined area of the storage device 3 as a circuit data base 8 and a set condition base 9 after composite, respectively. At this time, tester resources which are added beyond the specification of the tester by the circuit composite unit 7 are displayed on a display 10 through the input/output device 2 so that an operator can identify it.

Figure 2:
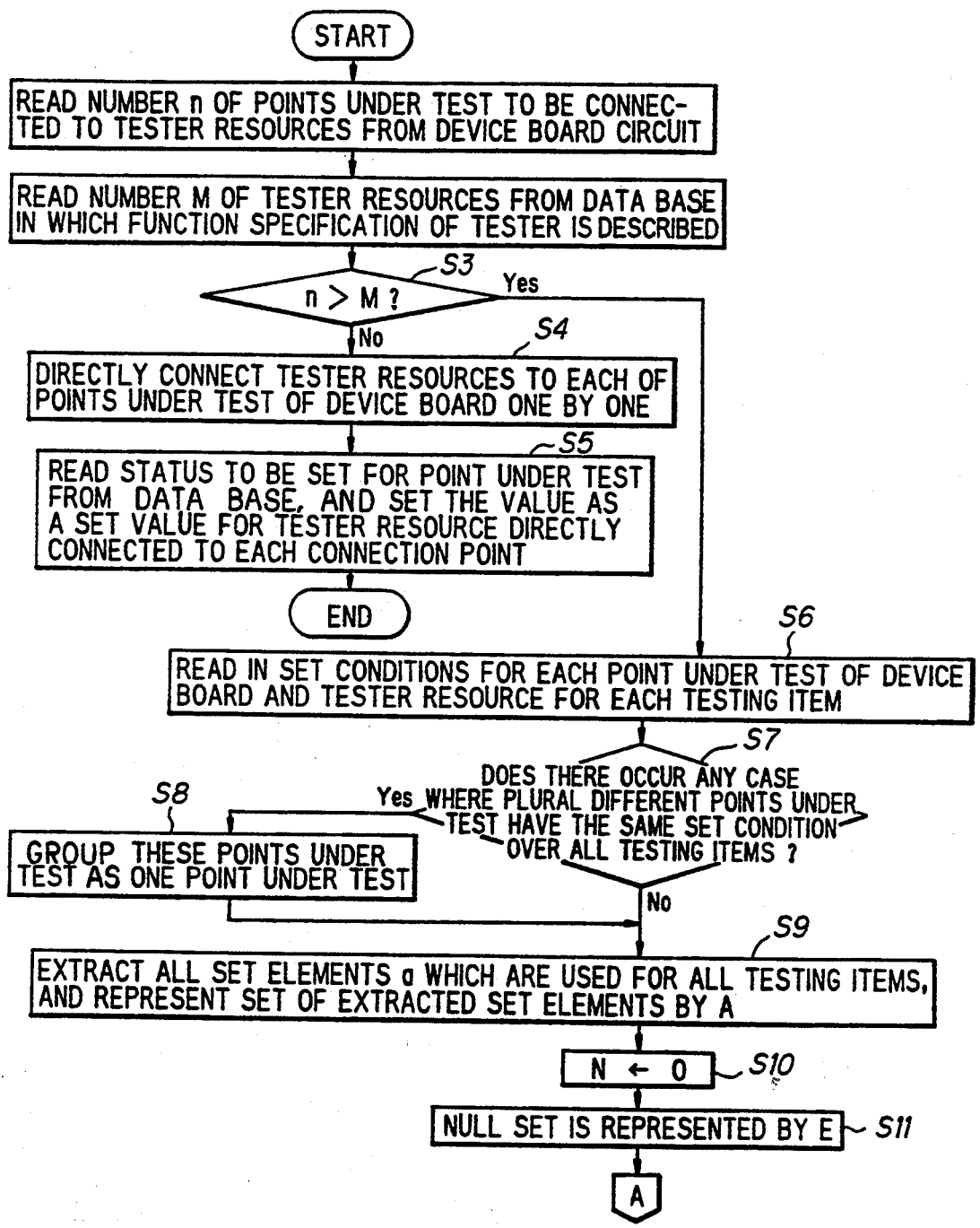
FIGS. 2 to 4 show a second embodiment according to this invention.
Figure 3:
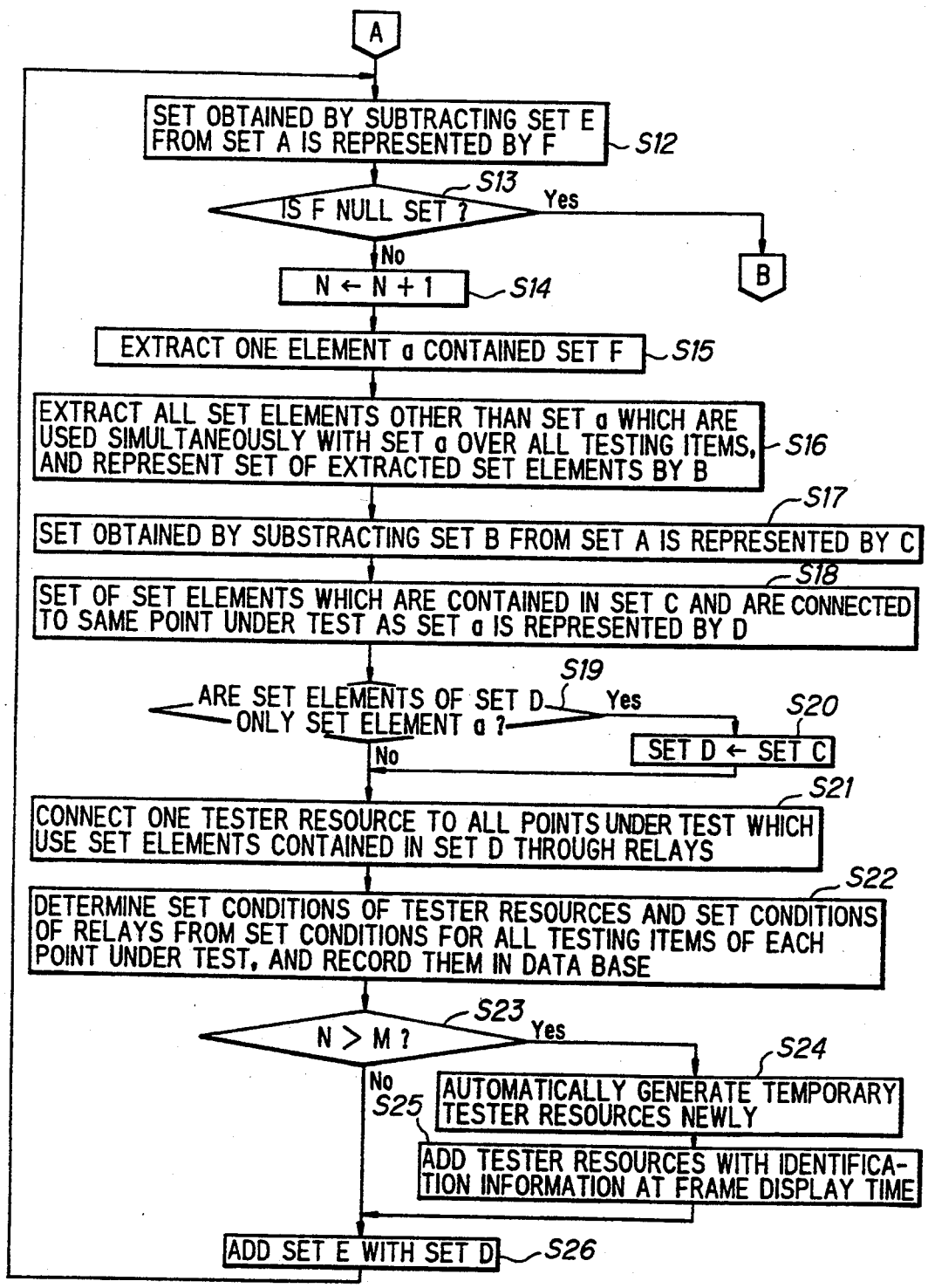
Figure 4:
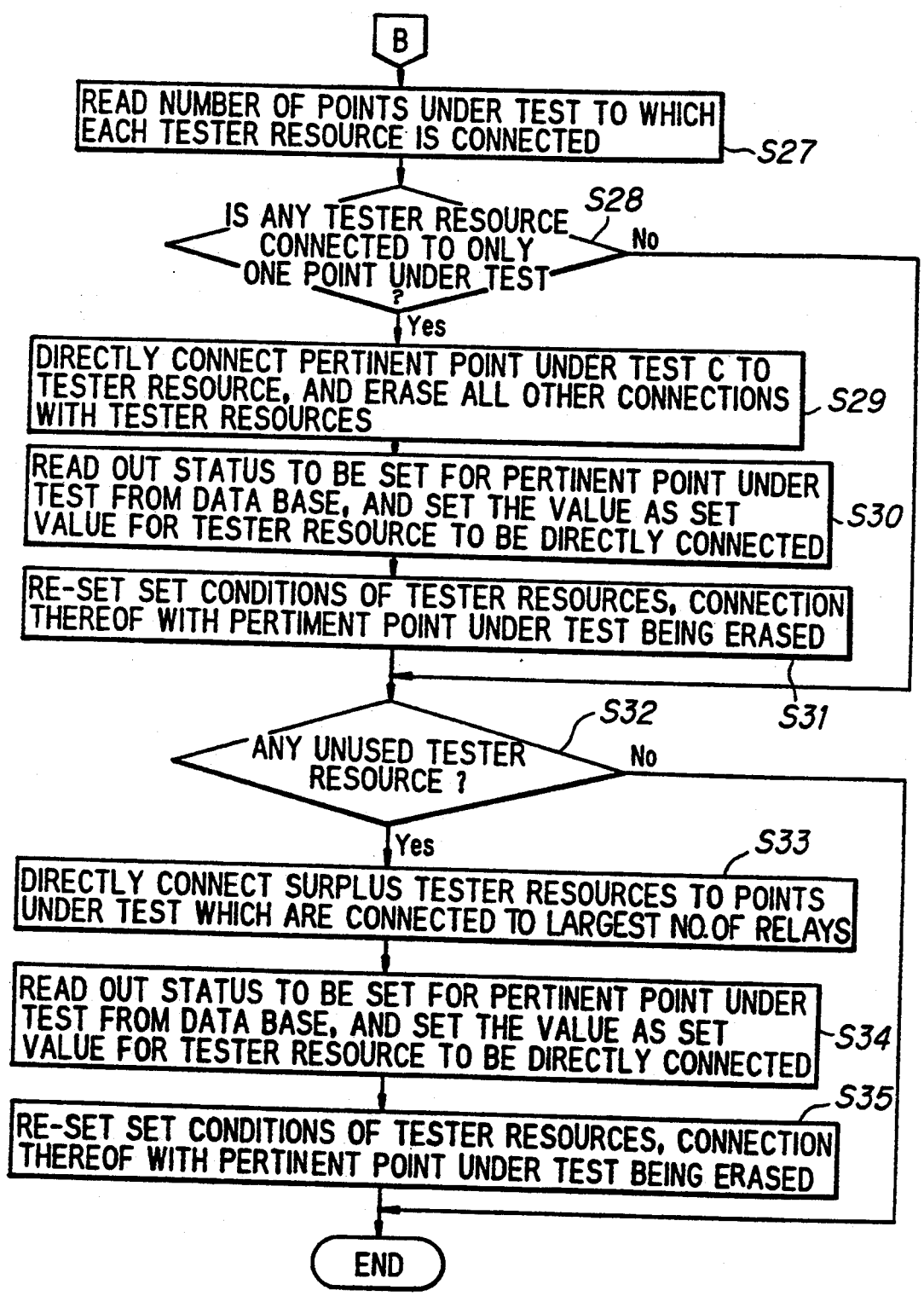

Next, a second embodiment of this invention will be described. An algorithm for a connection method according to this embodiment which is executed in the circuit composite unit 7 will be described with flowcharts of FIGS. 2 to 4.

First, the number n of points to be tested (hereinafter referred to as "points under test") of the device board circuit, which are to be connected to tester resources, is read out from the data base (step S1), and the number M of the tester resources is read out from the data base in which the function specification of the tester is described (step S2). Subsequently, it is determined whether the number n of the points under test is larger than the number M of the tester resources (step S3).

If n≦M, the tester resources are successively directly connected to each of the points under test in the device board one by one (step S4). Subsequently, a testing status to be set for the point under test is read out from the data base, and this status is set as a set value for the data resources connected to each point under test (step S5), thereafter terminating a series of connection processing.

Figures 5, 6:
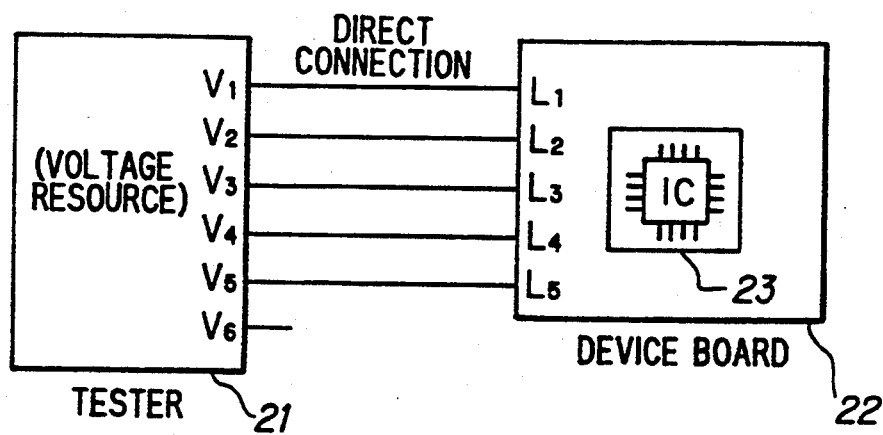
FIG. 5 is a table showing set conditions of points under test.
FIG. 6 is a connection diagram when the set conditions of FIG. 5 are set as follows: n=5, M=6.

Here, a case where the number n of the points under test of the device board is set to 5 and the number M of the tester resources is set to 6 will be described. FIG. 5 shows an example of set conditions of the points under test.

In this case, since the number n(=5) of the points under test of the device board is smaller than the number M(=6) of the tester resources, the tester resources (voltage resources) V1 to V5 are directly connected to the points under test L1 to L5 of the device board as shown in FIG. 6, and the setting of the tester resources is carried out. FIG. 7 shows an example of set conditions of the tester resources.

If n>M at the step S3, the set condition of each testing item for each point under test between the device board and the tester resource is read out (step S6).

Thereafter, it is determined whether there is any case where the plurality of different points under test have the same set condition over all the testing items (step S7). If there is the case where these points under test have the same set condition, these points under test are grouped as (represented by) one point under test (step S8).

Here, a case where the number n of the points under test of the device board is set to 6 and the number M of the tester resources is set to 3 will be described. FIG. 8 shows an example of set conditions of the points under test.

In this case, as is apparent from FIG. 8, any two of six points under test L1 to L6 do not have the same set condition over all the items T1 to T4, and thus no group (representation) processing is conducted on any of the plurality of points under test L1 to L6.

After the processing of the step S7 or step S8, all set elements (set values) a which are used for at least one of the testing items are extracted, and the set of these set elements is represented by A (step S9).

In this case, all set elements which are used for at least one of the testing items are seven (1V, 2V, 3V, 4V, 5V, 7V, 8V), and thus the above seven set elements are set in the set A.

Subsequently, the minimum number N of the indispensable tester resources is set to "0" (step S10), and a null set is represented by E (step S11). Subsequently, a set obtained by subtracting the set E from the set A is represented by F (step S12). In one processing, the set F is identical to the set A because the set E is a null set.

Subsequently, it is determined whether the set F is a null set (step S13). If the set F is not a null set, the minimum number N of the indispensable tester resources is incremented by "1" (step S14), and a set element a contained in the set F is extracted (step S15). Furthermore, all set elements which are other than the set element a and are used simultaneously with the set element a over all the testing items are extracted, and the set of the extracted set elements is represented by B (step S16).

Subsequently, the set obtained by subtracting the set B from the set A is represented by C (step S17), and the set of set elements out of the elements contained in the set C, which are connected to the same point under test as the set element a, is represented by D (step S18). Thereafter, it is determined whether the set elements of the set D are only the set element a (step S19).

If the set elements are only the set element a at the step S19, the set C is replaced by the set D (step S20). If these set elements are not the set element a, the set C is used without being modified. Thereafter, all points under test for which the set elements contained in the set D are used are connected to one tester resource through a relay (step S21).

Thereafter, on the basis of the set conditions for all the testing items for each point under test, the set conditions of the tester resources and the set conditions of the relays are determined and stored in the data base (S22). Subsequently, it is determined whether the minimum number N of the indispensable tester resources is larger than the number M of the tester resources which is read out from the data base (step S23).

If N≦M at the step S23, temporary tester resources are newly automatically generated (at a step S24), and then identification information at the time of a frame display are added to the tester resources (step S25). If N>M, the set E is directly added with the set D (step S26). Thereafter, the program returns to the step S12, and the processing as described above is repeated.

Here, in the processing of the step S15, a case where the set elements a are selected in the order of (1V, 2V, 3V, 4V, 5V, 7V, 8V) will be described.

(1) For 1V, the set D contains only the set element of 1V, and one of the tester resources is used at 1V.

(2) For 2V, the set D contains only the set element of 2V, and one of the tester resources is used at 2V.

(3) For 3V, the set D contains three set elements of 3V, 4V, 5V, and one of the tester resources is used while changing the set element to (3V, 4V, 5V).

(4) For 4V, 5V, no set element is contained in the set F, and thus no processing is carried out.

(5) For 7V, the set D contains two set elements of 7V, 8V, and one of the tester resources is used while changing the set element to (7V, 8V).

In this case, the number N (=4) is larger than the number M of the tester resources, and thus the following processing is carried out. That is, at the steps S24 and S25, temporary resources are newly prepared, and the identification information is added to the tester resources thus prepared so that an operator can identify these tester resources.

Figures 9, 10:
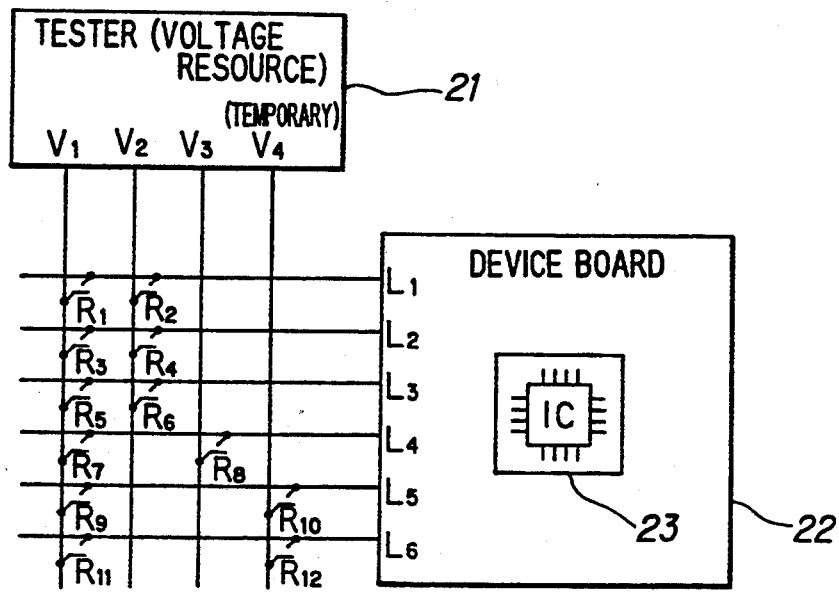
FIG. 9 is a connection diagram for N=6 and N=4.
FIG. 10 is a table showing set conditions of relays (a) and voltage resources (b) of the circuit as shown in FIG. 9.

Through the above processing, the minimum number N of the indispensable tester resources is equal to 4, and as shown in FIG. 9, these tester resources are connected to the device board. The set conditions are determined as shown in FIG. 10. In FIG. 9, R1 to R12 represent relays. In FIG. 10, (a) represents the set condition of the relays, and (b) represents the set condition of the voltage resources.

If the set F is a null set at the step S13, the number of points under test which are connected to each tester resource is read out (step S27), and subsequently it is determined whether there is any tester resource which is connected to only one point under test (step S28). In this embodiment, as is apparent from FIG. 9, the tester resource V1 is connected to six points under test L1 to L6, the tester resource V2 is connected to three points under test L1 to L3, the tester resource V3 is connected to one point under test L4, and the tester resource V4 is connected to two points under test L5 and L6. Accordingly, it is apparent that only the tester resource V3 is connected to the point under test L4.

As described above, if there is any tester resource which is connected to only one point under test, the pertinent point under test and the tester resource are connected to each other, and all connections with the other tester resources are erased (step S29).

Figures 11, 12:
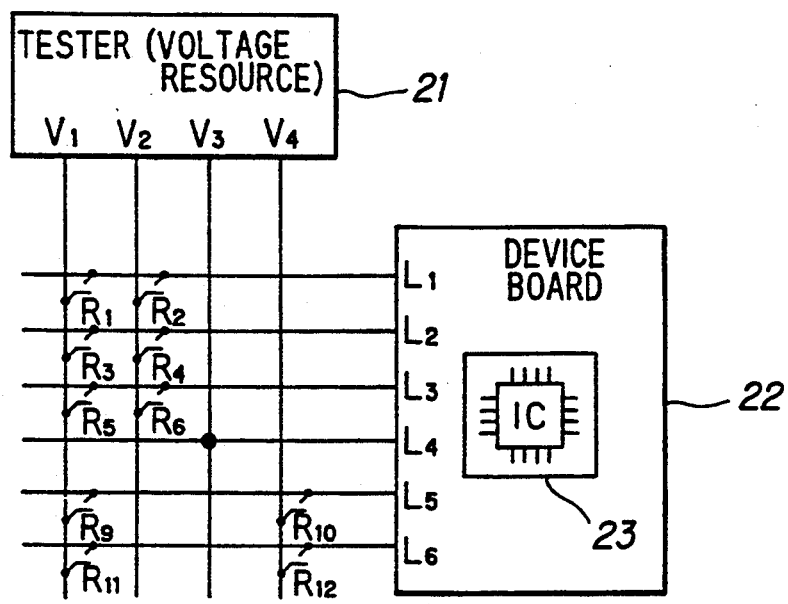
FIG. 11 is a connection diagram when the voltage resource V3 and the point under test L4 are directly connected to each other.
FIG. 12 is a table showing set conditions of relays (a) and resources (b) of the circuit as shown in FIG. 11.

That is, in this embodiment, the tester resource V3 and the point under test L4 are directly connected to each other, and the relay R8 is erased, and the relay R7 is erased to provide a non-connection between the point L4 under test and the tester resource V1. FIG. 11 shows a circuit in which the tester resource V3 is directly connected to the point under test L4.

Subsequently, the state to be set for the pertinent point under test is read out from the data base, and this value is set as the set value for the directly-connected tester resource (step S30). Thereafter, the set condition of the tester resource whose connection with the pertinent point under test is erased is reset again (step S31).

FIG. 12 shows the set conditions of relays (a) and the set conditions of tester resources (b) for the circuit as shown in FIG. 11.

Subsequently, it is determined whether any unused tester resource exists (step S32). If no unused tester resource exists, a series of connection processing is terminated with no further action.

On the other hand, if any unused tester resource exists, such surplus tester resources are directly connected to the point under test which is connected to a largest number of relays (step S33). In this case, assuming that the number M of the tester resources is equal to 5, the tester resource V5 remains because M=5.

Figures 13, 14:
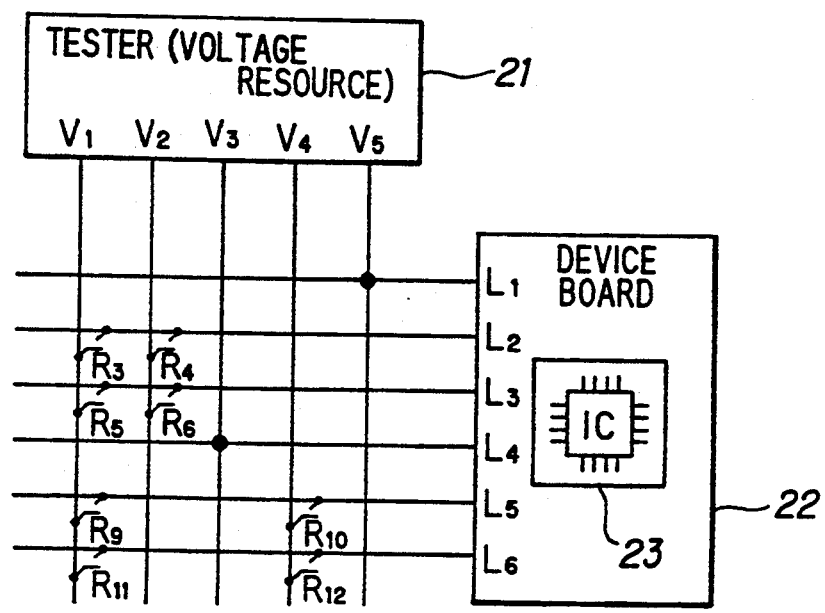
FIG. 13 is a connection diagram for M=5.
FIG. 14 is a table showing set conditions of relays (a) and tester resources (b) of the circuit as shown in FIG. 13.

Here, as is apparent from the circuit of FIG. 11, two relays are affixed to each of the points under tests L1 to L3, L5 and L6, and for convenience the point under test L1 is directly connected to the tester resource V5, and the relay between the point under test L1 and the tester resources V1, V2 is erased. FIG. 13 shows a circuit in which the tester resource V5 is directly connected to the point under test L1 for M=5.

Subsequently, the state to be set for the pertinent point under test is read out from the data base, and this value is set as a set value for the tester resource to be directly connected to the point under test (step S34). Thereafter, the set condition of the tester resource whose connection with the pertinent point under test is erased is reset again (step S35), thereafter terminating the series of connection processing.

FIG. 14 shows the set conditions which are calculated for the relays R3 to R-12 and the tester resources V1 to V5 in the circuit of FIG. 13. In FIG. 14, (a) represents the set conditions of the relays, and (b) represents the set conditions of the tester resources.

In the above embodiment, only the case where this invention is applied to the IC characteristic testing (measurement) was described; however, this invention is not limited to the above embodiment. For example, this invention is applicable to the characteristic testing (measurement) of general multi-terminal devices other than the IC.

As described above, according to the above embodiments, the net list in which points under test of a device board and tester resources are connected to each other directly or through relays is automatically prepared on the basis of the set conditions for the points under test of the device board circuit every test and the number of resources which is inherent to a tester. In addition, the set conditions between the used tester resources and the relays every test are automatically prepared, and stored in a file. Accordingly, the circuit design of the device board circuit can be automatically performed by a computer. Therefore, a special knowledge of a tester is not required, and the step number of the circuit design can be greatly reduced. In addition, a circuit is produced in accordance with a constant rule, so that the maintenance of the produced circuits can be easily performed, and the circuits can be produced rationally using the resources of the tester and the relays.

Next, a third embodiment according to this invention will be described.

Figure 15:
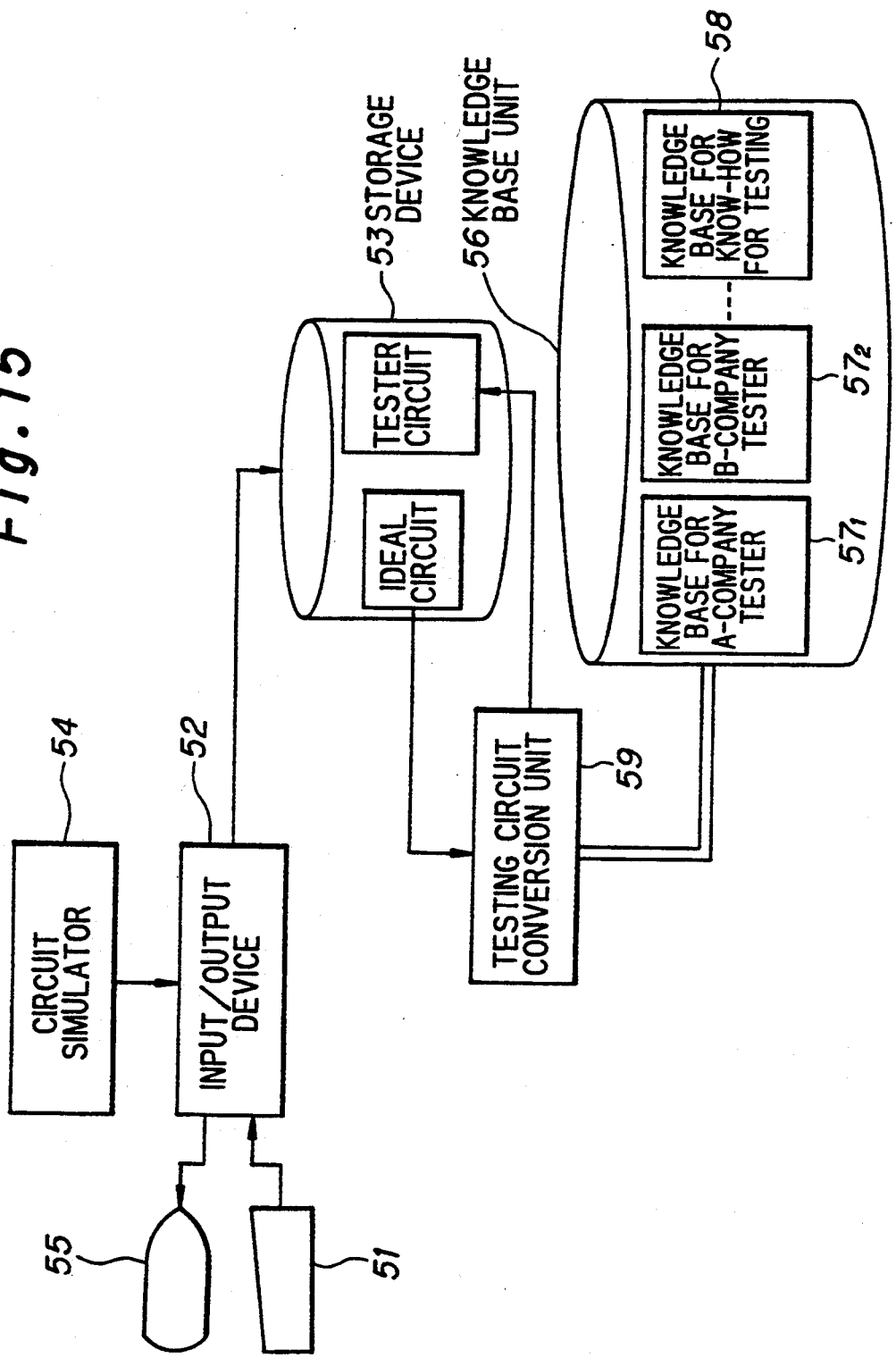
FIG. 15 is a systematical block diagram showing a third embodiment according to this invention.

FIG. 15 is a systematical diagram showing a third embodiment according to this invention.

In FIG. 15, data on an ideal signal source, an ideal detector or a peripheral part having ideal characteristics are input as data of an ideal testing circuit through an input unit 51 such as a key board by a circuit designer. The data of the ideal testing circuit is written in a predetermined area of a storage device 53 through an input-/output device 52. It can be checked on a display 55 using a circuit simulator 54 whether the data of the ideal testing circuit written in the storage device 53 is correctly described. If the description of the data is incorrect, the correction can be made using the input unit 51 and the input/output device 52.

A knowledge base unit 56 includes tester knowledge base files $57_1$, $57_2$, . . . for treating one or plural maker's testers, and a testing know-how knowledge base file 58 in which a testing method is described.

In the tester knowledge base files $57_1$, $57_2$, . . . are stored a knowledge base the specification and the characteristics of a tester of each maker. The knowledge base file corresponding to a tester which is actually used for testing (measurement) is indicated through the input unit 51 by a test engineer.

On the other hand, in the testing know-how knowledge base file 58, a knowledge base on Know-How of a skilled test engineer is stored for how to set the amount of an amplifier for a signal level, etc. Such a know-how can be provided for each tester used for testing.

A testing circuit conversion unit 59 converts the data of the ideal testing circuit which is described with the data on the ideal signal source, detector and peripheral parts and written in a storage device 53 to data of a tester testing circuit which is measurable with a tester actually used for the characteristic testing, on the basis of each knowledge base of the tester knowledge base files $57_1$, $57_2$, . . . and the testing know-how knowledge base file 58.

The data of the tester testing circuit is written in a predetermined area of the storage device 53. An actually-used tester testing circuit is so designed that the operation can be checked using a circuit simulator 54.

Next, the actual design of a testing circuit using the testing circuit design apparatus thus constructed will be described by exemplifying a case where the characteristics of an IC having 6 pins is tested (measured).

Figure 16:
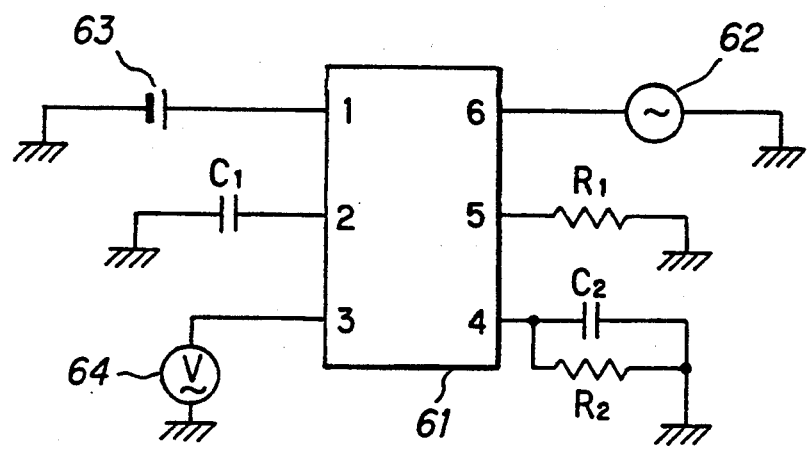
FIG. 16 is a circuit diagram of an ideal testing circuit before alteration.

First, a circuit designer represents a testing circuit for the characteristics of an IC under test using an ideal signal source 62, an ideal voltage source 63, an ideal detector 64 and peripheral parts R1, R2, C1, C2 having ideal characteristics as shown in FIG. 16, and inputs then through an input unit 51. Further, he writes the data of this ideal circuit through an input/output device 52 into a storage device 53. Subsequently, through the input unit 51, a test engineer specifies the tester knowledge base files $57_1$, $57_2$, . . . which are suitable for a tester used for an actual characteristic measurement.

Figure 17:
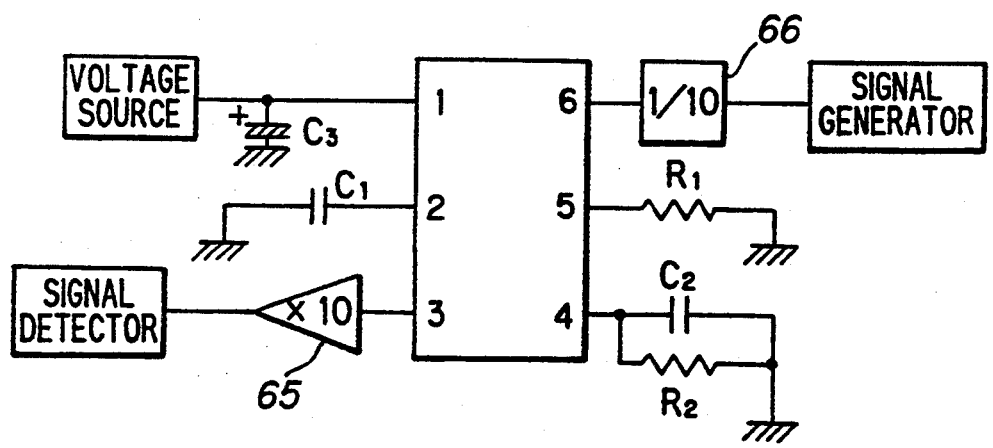
FIG. 17 is a circuit diagram of a testing circuit for tester which is actually used after alteration.

In the testing circuit conversion unit 59 as shown in FIG. 15, on the basis of the knowledge base such as a signal level, a signal waveform, a signal frequency, etc. which are obtained from the corresponding knowledge base file and in consideration of the know-how of a skilled test engineer which is obtained from the testing know-how knowledge base file 58, as shown in FIG. 17, an amplifier 65 and an attenuator 66 are inserted between the tester and the IC under test 61, or a peripheral circuit such as a capacitor C3 which is required for an actual measurement (testing) is automatically added to thereby automatically convert the input circuit to a testing circuit which is capable of measuring the IC under test 61 with the actually-used tester. At this time, each of those peripheral parts (R1, R2, C1, C2) which are not required for the conversion remains without being converted.

As described above, by preparing the tester knowledge base files $57_1$, $57_2$, . . . for treating each maker's tester and the testing know-how knowledge base file 58 in which the know-how of a skilled test engineer is described, the specification for the testing can be described with an ideal signal source 62, an ideal voltage source 62, an ideal detector 64 and ideal peripheral parts R1, R2, C1, C2, and thus the content of the testing can be easily described.

Further, the circuit simulation can be performed using the circuit simulator 54, and thus an erroneous description of the specification can be easily found out. In addition, no test engineer is required for the conversion to an actual testing circuit, so that the number of steps required for the design can be greatly reduced. Still further, the conversion to circuits suitable for plural kinds of testers can be performed by merely preparing a knowledge base, so that even when an used tester is altered for certain reasons on a production line, a rapid action can be performed for this alteration.

For the characteristic testing (measurement) of an IC, a testing circuit having the circuit structure which is varied in accordance with each testing item, and thus testing circuits for several hundreds of testing items are required to be composited to one overall or integrated testing circuit. A fourth embodiment according to this invention which meets this requirement is shown in FIG. 18.

Figure 18:
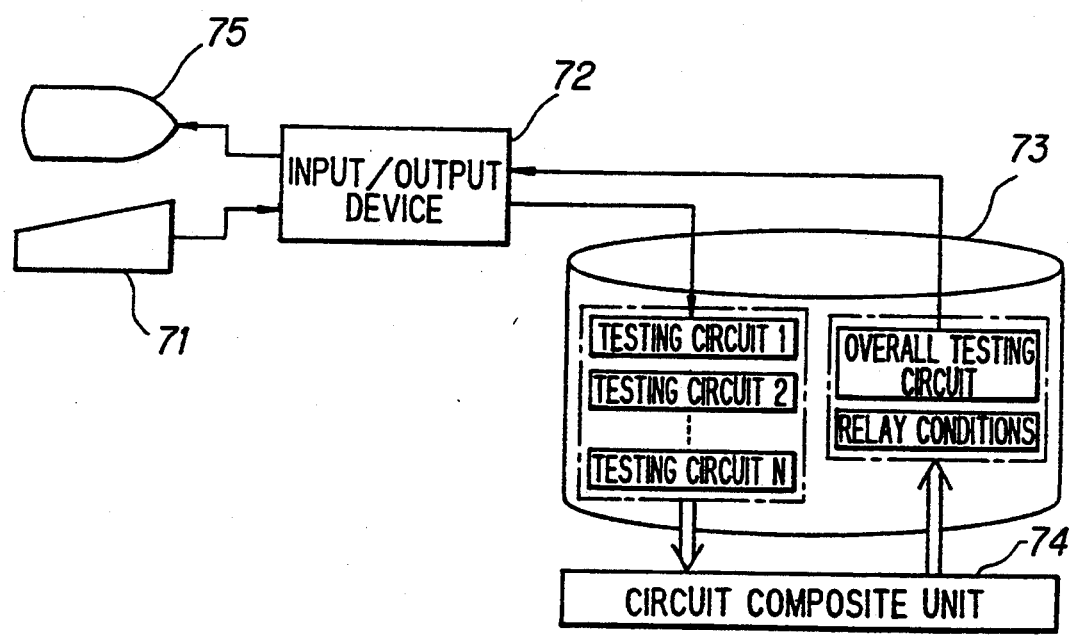
FIG. 18 is a systematical block diagram showing a fourth embodiment according to this invention.
Figure 19A:
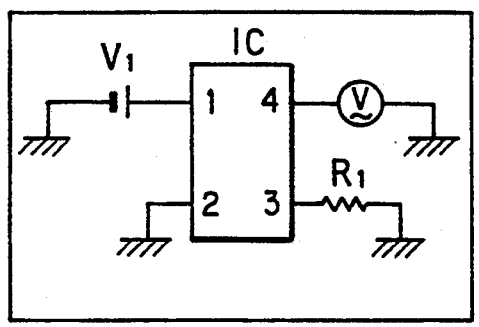
FIGS. 19A to 19D is a circuit diagram showing a circuit for each testing item before circuit composite.
Figure 19B:
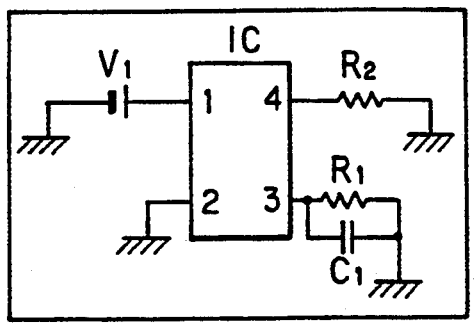
Figure 19C:
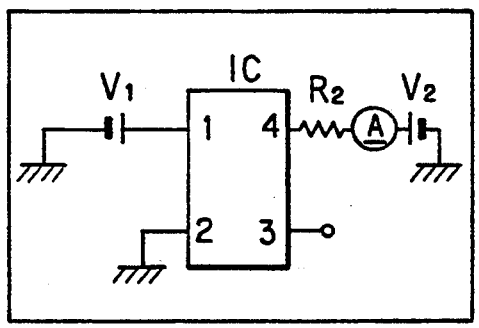
Figure 19D:
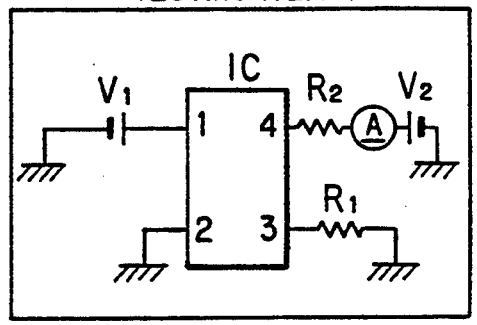

In FIG. 18, data on testing circuits 1 to N for respective testing items are input as data of ideal testing circuits through an input unit 71, and net lists thereof are prepared in a storage device 73. On the basis of these net lists, the testing circuits for the testing items are processed to be composited to one testing circuit in a circuit composite unit 77.

That is, the circuit composite unit reads out a desired number (corresponding to the number of items to be tested) of net lists of the testing circuits each of which is written for each testing item in the storage device 73, and on the basis of the net list of the read-out plural testing circuits, an ideal overall testing circuit is composited, and the net list is output. At the same time, a relay condition file for making an equivalent circuit for each testing item with relays inserted into the overall testing circuit is prepared, and stored in the storage device 3.

On the basis of the net list of the overall testing circuit stored in the storage device 73 and the relay condition file, the operator can know one circuit diagram which satisfies the content of each input testing circuit and relays to be driven for each testing.

Figure 20:
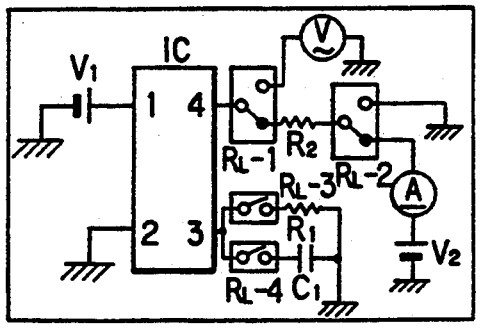
FIG. 20 is a schematic diagram showing an overall testing circuit and a relay condition file after the composite.

Next, a fifth embodiment according to this invention will be described in a case where testing circuits (as shown in FIGS. 19A to 19D) for respective testing items 1 to 4 as shown in FIG. 19 are composited to one overall testing circuit (a) as shown in FIG. 20 in the circuit composite unit 77, and the algorithm for forming the relay condition file (b) thereof as shown in FIG. 20 will be described with reference to flowcharts of FIGS. 21 and 22. Here, it is assumed that the data on testing circuits for several hundreds of testing items which are used for the IC characteristic testing (measurement) are beforehand input and stored as net lists in the storage device 73.

Figure 21:
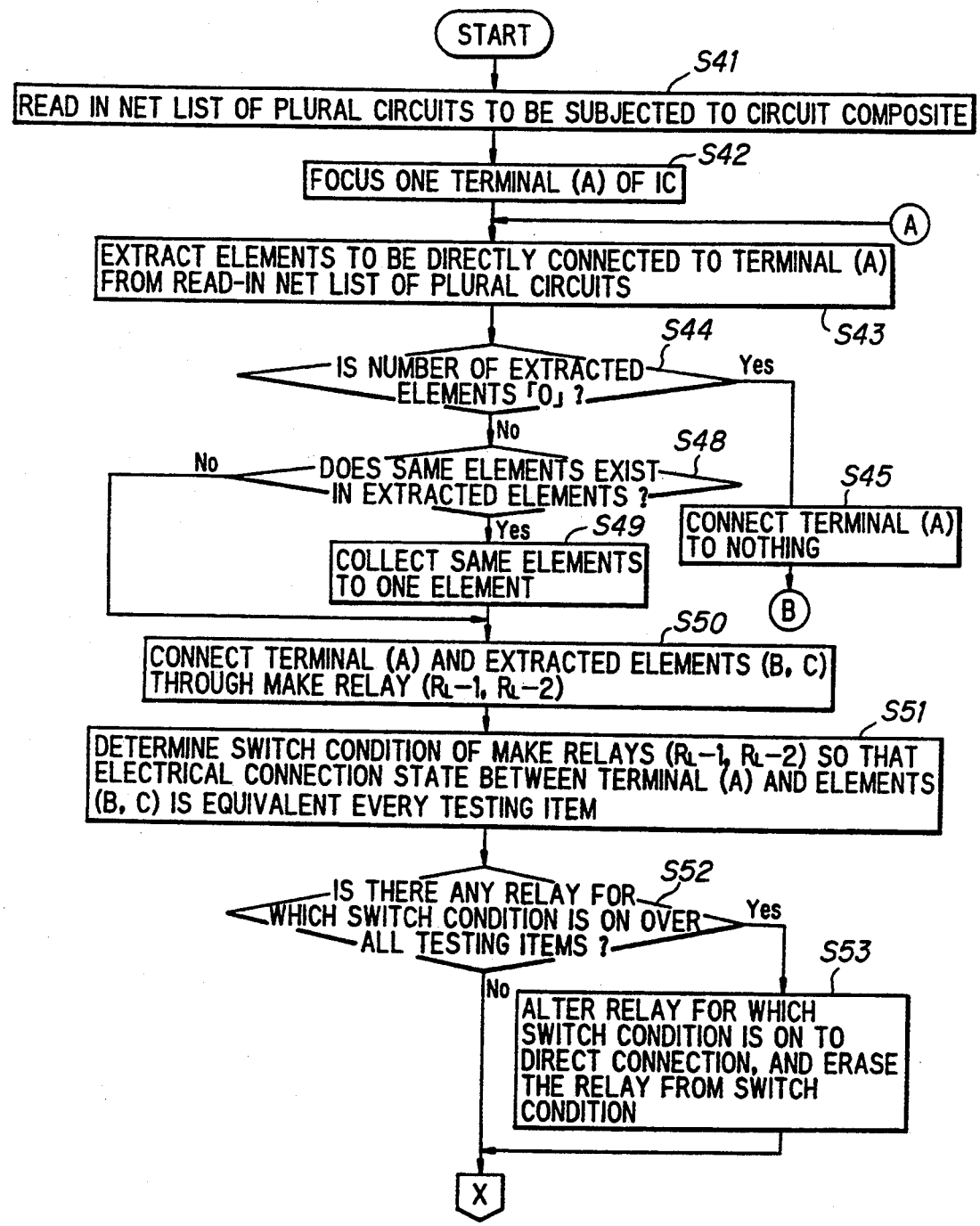
FIGS. 21 and 22 is a fourth flowchart showing an algorithm of the circuit composite which is a fifth embodiment according to this invention.
Figure 22:
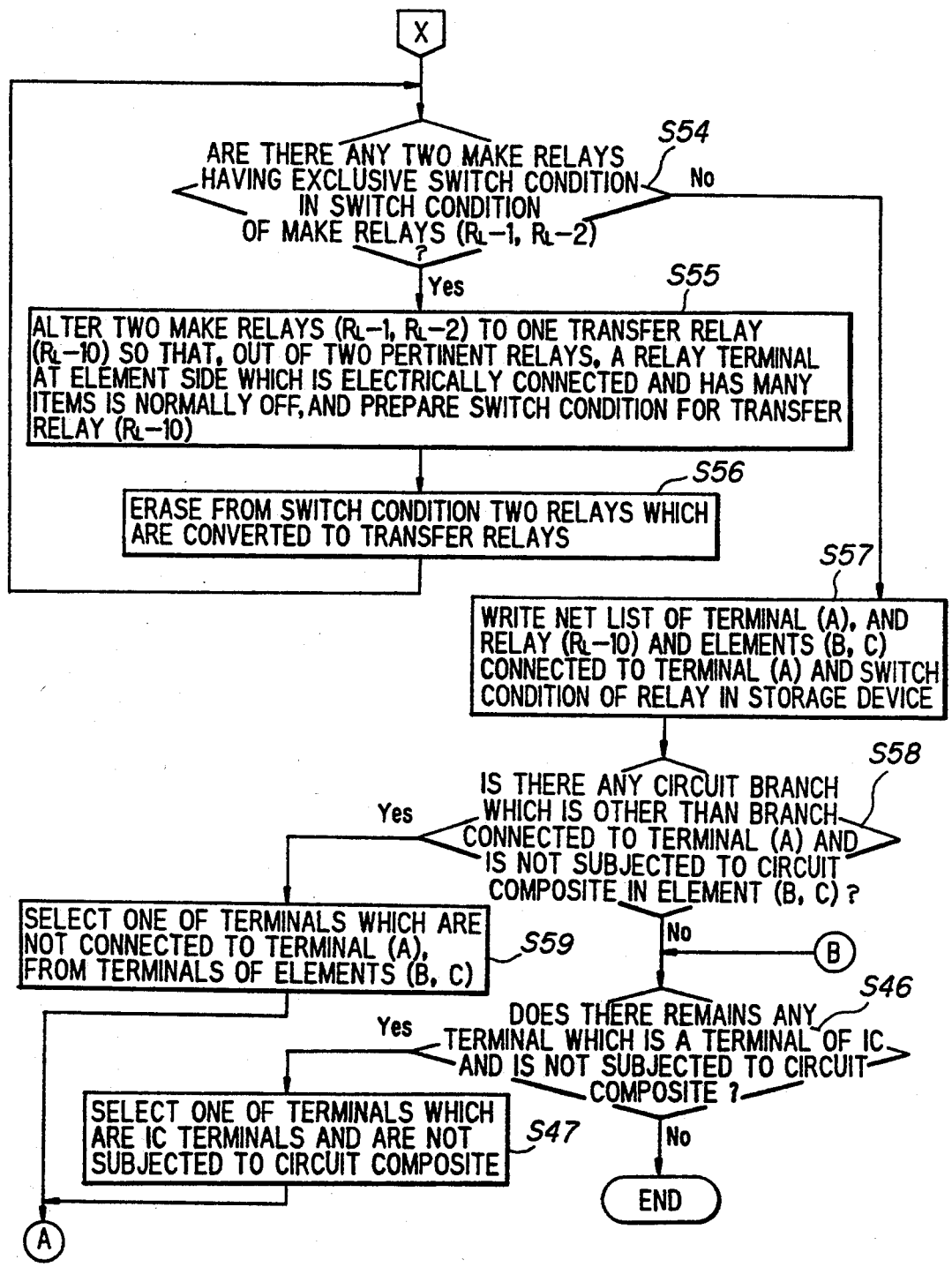

In the flowcharts of FIGS. 21 and 22, net lists of plural testing circuits to be composited are first read out from the storage device 3 (step S41). Subsequently, by paying attention to a terminal A of an IC (step S2), as shown in FIG. 23A, an element which is directly connected to the terminal A is extracted from the net lists of the plural testing circuits which have been already read in (step S43).

Subsequently, it is determined whether the number of the extracted elements is equal to "0" (step S44). If the number is judged to be "0", nothing is connected to the terminal A (step S45), and it is judged whether there remains any terminal which is one of the IC terminals and is not subjected to the circuit composite (step S46).

If any terminal remains at the step S46, one of those elements of the IC which are not subjected to the circuit composite is selected (step S47), and the program goes to the step S43 to repeat the circuit composite using the selected terminal as a terminal A. If no terminal remains at the step S46, a series of processing is terminated.

If the number is determined not to be "0" at the step S44, it is determined whether the same elements exist in the extracted elements (step S48). If the determination at the step S48 is "Yes", as shown in FIG. 23B, the same elements are collected to (represented by) one element (step S49). This collection processing is not carried out if any two elements are not identical. Thereafter, as shown in FIG. 23C, the terminal A and the extracted elements B, C are connected to each other through make relays $R_L$-1, $R_L$-2 (step S50).

Subsequently, a switch condition (a) for the make relays $R_L$-1, $R_L$-2 as shown in FIG. 24 are determined so that the electrical connection state between the terminal A and the elements B, C is equivalent for each testing item (step S51), and then it is determined whether there is any relay whose switch condition is ON over all the testing items (step S52).

If there is any relay whose switch condition is ON over all the testing items, those relays whose switch condition is entirely ON are altered to direct connection, and these relays are erased from the switch condition (a) (step S53). This erasing operation is not carried out if these relays do not exist. Thereafter, it is determined whether any two make relays whose switch conditions are exclusive exist in the switch condition (a) of the make relays $R_L$-1, $R_L$-2 (step S54).

If there are any two make relays which have the exclusive relationship in switch condition, in order to keep to a normally off state a relay terminal of an element side (one of the pertinent two relays) having a larger number of electrical connection items, as shown in FIG. 23D, the two make relays $R_L$-1, $R_L$-2 are altered to one transfer relay $R_L$-10, the switch condition (b) of this transfer relay $R_L$-10 is prepared (step S55), and then the two relays which are converted to the transfer relays are erased from the switch condition (a) (step S56). Subsequently, the program returns to the step S54.

If no two relays having the exclusive relationship in switch condition exist, the net list of the terminal A and the relay $r_L$-10 and the elements B, C connected to the terminal A and the switch conditions (a), (b) of the relays are written in the storage device 3 8step S57), and then it is judged whether there is any circuit branch which is other than branch connected to terminal (A) and is not subjected to circuit composite in elements (B, C) (step S58).

If any circuit branch exists, one of the terminals which are occupied by the elements B, C and are not connected to the terminal A is selected (step S59), and the program returns to the step S43 to repeat the circuit composite using the selected terminal as a new terminal A. On the other hand, if no branch circuit exists, the program goes to the step S46 directly.

The above embodiment relates to the case where this invention is applied to the IC characteristic testing (measurement), however, this invention is not limited to this embodiment. This invention is applicable to the characteristic testing (measurement) for general multi-terminal devices other than the IC.

As described above, according to this invention, a characteristic testing circuit for a multi-terminal device such as an IC is represented and input using signal source, signal detector, etc. which have ideal characteristics, and then the ideal testing circuit thus input is automatically converted to a testing circuit which can be measured by an actually-existing tester on the basis of the knowledge base of a test engineer having a skilled knowledge on ideal testing circuits. Therefore, no test engineer is required to be present when the ideal testing circuit is converted to an actual testing circuit, and the number of steps of the design can be greatly reduced. In addition, a countermeasure can be rapidly made for alteration of an employed tester.

Although various minor changes and modifications might be suggested by those skilled in the art, it will be understood that we wish to include within the scope of the patent warranted hereon all such changes and modifications as reasonably come within our contribution to the art.

We claim as our invention:

1. A connection method for connecting a tester for measuring characteristics of a multi-terminal device, and wherein a device board is disposed between the multi-terminal device and the tester, comprising the steps of:
    reading out a number n of points under test of the device board and a number M of resources of the tester;
    comparing the number n of the points under test and the number M of the resources of the tester, and connecting the tester and the device board in accordance with a result of the comparison;
    determining a minimum number N of the M resources which are required to perform all testings when the comparison result is n>M;
    determining set values which are allotted to the N resources;
    connecting the N resources and the n points under test to each other through relays so that a testing condition is satisfied;
    determining set conditions for each resource and relays for each testing item; and
    adding identification information with last (N−M+1) resources when N>M.

2. The connection method as claimed in claim 1, further comprising the steps of:
    preparing a net list for directly connecting the resources of the tester to the points under test in a one-to-one correspondence when the comparison result is that n≦M, and directly setting a set value of each point under test for each testing item as a set value for each resource.

3. The connection method as claimed in claim 1, further comprising the steps of:
    reading out the number of points under test to be connected to each resource; and when there is any unused surplus resource, successively connecting said surplus resource to a point under test which is connected to a largest number of relays.

4. The connection method as claimed in claim 1, further comprising the steps of:

reading out the number of points under test to be connected to each resource; and when a resource is connected to only one point under test, directly connecting the resource to said point under test.

5. A testing circuit design apparatus for a multi-terminal device, comprising:

an input unit for inputting data of an ideal testing circuit;

a storage unit for storing the data of the ideal testing circuit input from said input unit;

a knowledge base unit having a knowledge base and a testing method suitable for a tester of each manufacturer;

a testing circuit conversion unit for converting the data of the ideal testing circuit written in said storage unit to data of an actual testing circuit actually used for characteristic measurement on the basis of each knowledge base of said knowledge base unit, and for writing the converted data into said storage unit;

net lists for the input ideal testing circuit for each testing item input from said input unit being stored in said storage unit;

a circuit composite unit for reading plural net lists from said storage unit to read elements connected to each terminal of said multi-terminal device and for compositing an overall testing circuit;

said circuit composite unit arranging elements connected to each terminal of said multi-terminal device so that the same elements are not overlapped at a same terminal;

a make relay interposed between the terminal and each element; and an ON/OFF condition of said make relay for each testing item being stored in said storage unit, 6. The testing circuit design apparatus as claimed in claim 5, further comprising a circuit simulator for checking an operation of said actual testing circuit on the basis of the storage data of said storage unit.

7. A connection method for connecting a tester for measuring characteristics of a multi-terminal device, and wherein a device board is disposed between the multi-terminal device and the tester, comprising the steps of:

determining a number n of points under test of the device board and a number M of resources of the tester;

comparing the number n of the points under test and the number M of the resources of the tester, and connecting the tester and the device board in accordance with a result of the comparison;

when n is $<M$, directly connecting the resources of the tester to the points under test in a one-to-one correspondence and directly setting a set value of each point under test for each testing item as a set value for each resource; and when n is $>M$, a set condition of each testing item for each point under test between the device board and the tester resource is determined, and if a plurality of different points under test have the same set condition over all the testing items, these points under test are grouped as one point under test for connection to one of the resources.

* * * * *